(12) United States Patent
Kuo

(10) Patent No.: US 9,817,168 B2
(45) Date of Patent: Nov. 14, 2017

(54) CIRCUIT MODULE

(71) Applicant: ALSON TECHNOLOGY LIMITED, Kowloon OT (HK)

(72) Inventor: Chi-Fen Kuo, Zhubei (TW)

(73) Assignee: Alson Technology Limited, Kowloon (HK)

( * ) Notice: Subject to any disclaimer, the term of this patent is extended or adjusted under 35 U.S.C. 154(b) by 123 days.

(21) Appl. No.: 15/051,096

(22) Filed: Feb. 23, 2016

(65) Prior Publication Data

US 2016/0334559 A1    Nov. 17, 2016

(30) Foreign Application Priority Data

May 12, 2015  (TW) .............................. 104207268 U

(51) Int. Cl.
*F21V 8/00* (2006.01)
*H05K 5/02* (2006.01)
*G06F 1/18* (2006.01)

(52) U.S. Cl.
CPC .......... *G02B 6/0001* (2013.01); *G06F 1/186* (2013.01); *H05K 5/026* (2013.01)

(58) Field of Classification Search
CPC .. G02B 6/0001; G02B 6/0041; G02B 6/0083; G02B 6/428; G06F 1/186; H05K 5/026; G02F 1/13306; H04N 1/02835; F21K 9/52; G01D 11/28; G12B 11/00
See application file for complete search history.

(56) References Cited

U.S. PATENT DOCUMENTS

| 7,174,470 B2* | 2/2007 | Percer ................... G06F 1/3203 370/362 |
| 2003/0080762 A1* | 5/2003 | Kim ...................... G11C 29/48 324/756.02 |
| 2005/0132118 A1* | 6/2005 | Chen ..................... G06F 13/409 710/315 |
| 2011/0296257 A1* | 12/2011 | Cao ..................... G06F 11/2284 714/57 |

FOREIGN PATENT DOCUMENTS

TW      M263537 U     5/2005

* cited by examiner

*Primary Examiner* — Joseph L. Williams
*Assistant Examiner* — Jose M Diaz
(74) *Attorney, Agent, or Firm* — Muncy, Geissler, Olds & Lowe, P.C.

(57) ABSTRACT

A circuit module is provided, including: a substrate, having a PCI-E or PCI strip, the PCI-E or PCI strip for being inserted into and electrically connected with a PCI-E or PCI slot; at least one LED, disposed at a side of the substrate opposite to the PCI-E or PCI strip, electrically connected with the PCI-E or PCI strip; a light guide member, being pervious to light, at least corresponding to the at least one LED.

13 Claims, 7 Drawing Sheets

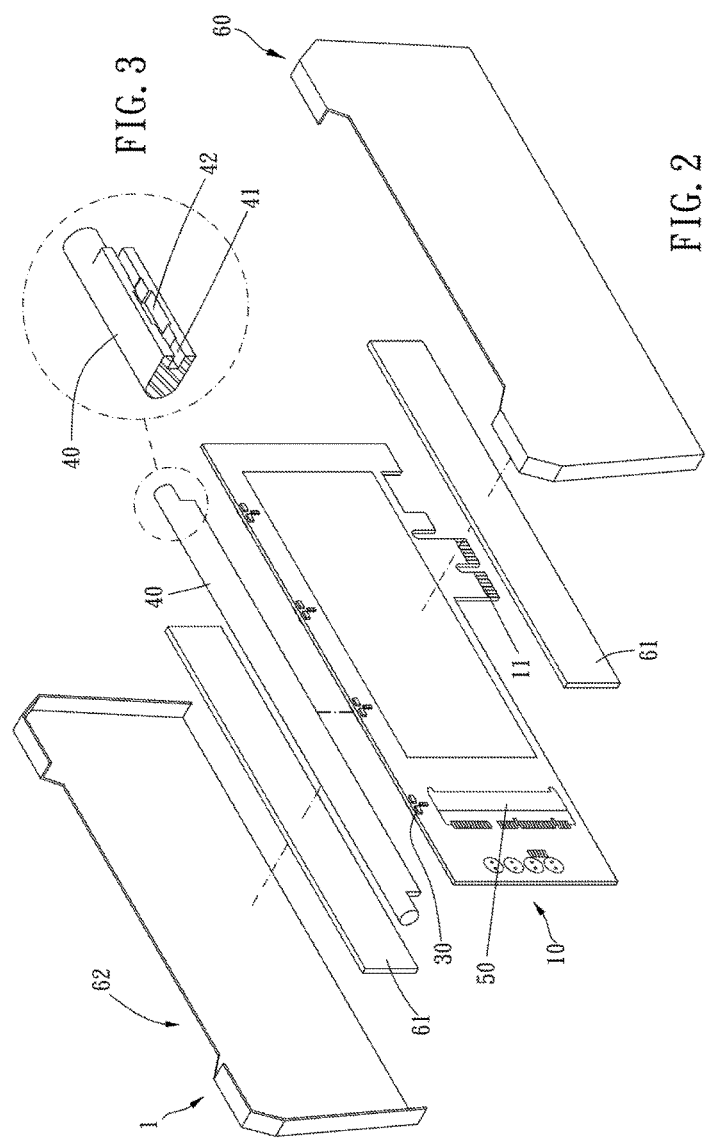

CIRCUIT MODULE

BACKGROUND OF THE INVENTION

Field of the Invention

The present invention relates to a circuit module.

Description of the Prior Art

TWM263537 discloses a circuit module including a circuit substrate and a plurality of electric devices. The electric devices are electrically connected to an electric strip via at least one circuit, and at least one LED is electrically connected between the electric devices and the electric strip by the at least one circuit. Through the at least one circuit the LED can be control to be on or off.

However, the above-mentioned conventional circuit module has no buffering member or shield for the LED on the substrate, so that light from the LED directly projects to one's eye, and the eye is unpleasant and uncomfortable with the light.

The present invention has arisen to mitigate and/or obviate the afore-described disadvantages.

SUMMARY OF THE INVENTION

The major object of the present invention is to provide a circuit module, in which a light guide member pervious to light covers LED, and the light guide member can absorb and refract the light from the LED, and thus the light can be distributed evenly and is gentle and pleasant to the eye.

To achieve the above and other objects, a circuit module is provided, including: a substrate, having a PCI-E strip, the PCI-E strip for being inserted into and electrically connected with a PCI-E slot; at least one LED (light emitting diode), disposed at a side of the substrate opposite to the PCI-E strip, electrically connected with the PCI-E strip; a light guide member, being pervious to light, at least corresponding to the at least one LED.

To achieve the above and other objects, a circuit module is provided, including: a substrate, having a PCI strip, the PCI strip for being inserted into and electrically connected with a PCI slot; at least one LED, disposed at a side of the substrate opposite to the PCI strip, electrically connected with the PCI strip; a light guide member, being pervious to light, at least corresponding to the at least one LED.

The present invention will become more obvious from the following description when taken in connection with the accompanying drawings, which show, for purpose of illustrations only, the preferred embodiment(s) in accordance with the present invention.

BRIEF DESCRIPTION OF THE DRAWINGS

FIG. 2 is a breakdown view of a preferred embodiment of the present invention;

FIG. 3 is a partial enlarged drawing of a light guide member of a preferred embodiment of the present invention;

DETAILED DESCRIPTION OF THE PREFERRED EMBODIMENTS

The present invention will be clearer from the following description when viewed together with the accompanying drawings, which show, for purpose of illustrations only, the preferred embodiment in accordance with the present invention.

Please refer to FIGS. 1 to 7 for a preferred embodiment of the present invention. A circuit module 1 includes a substrate 10, at least one LED 30 and a light guide member 40 pervious to light.

Figure 1:
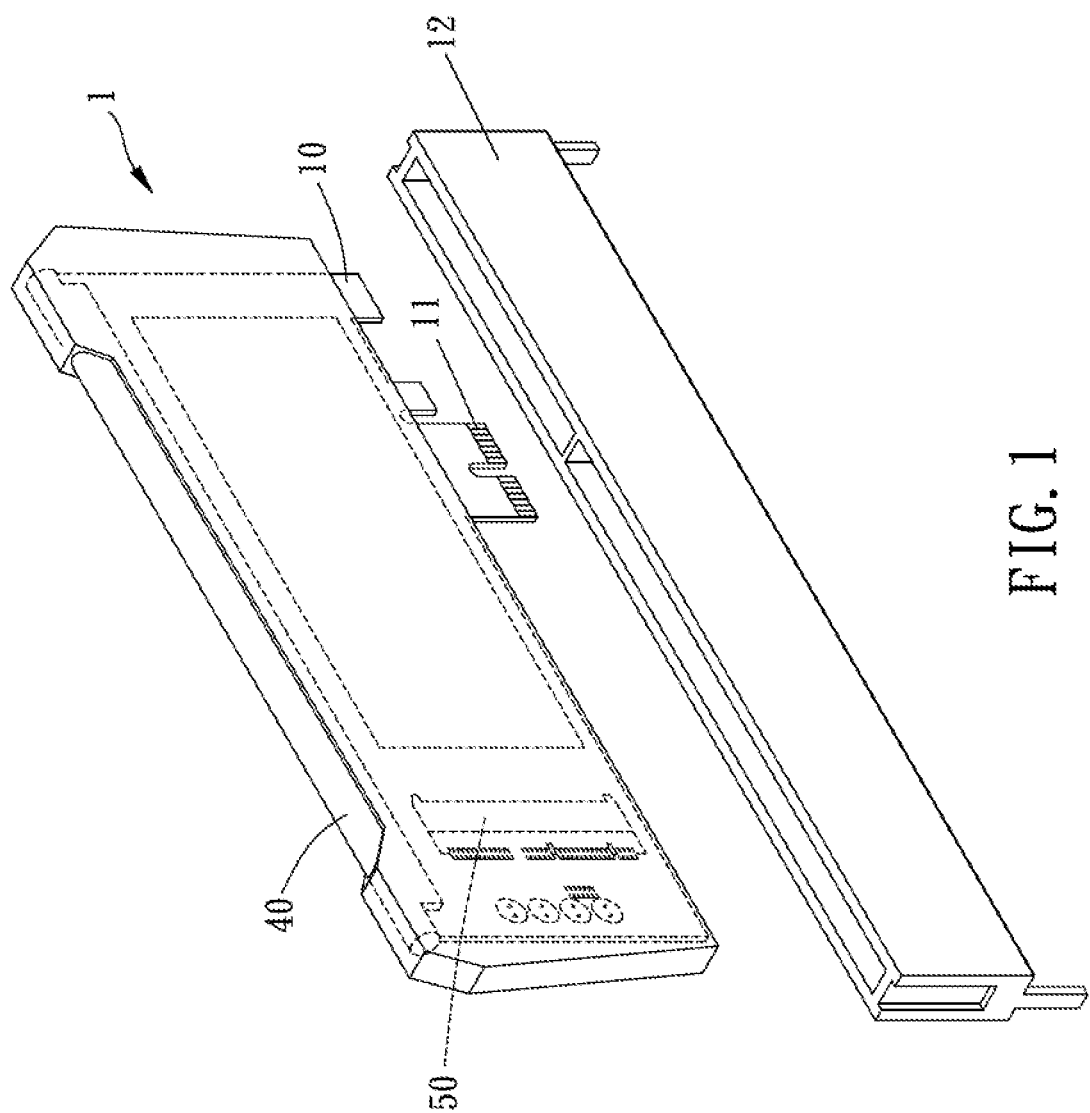
FIG. 1 is a perspective view of a preferred embodiment of the present invention.
Figure 4:
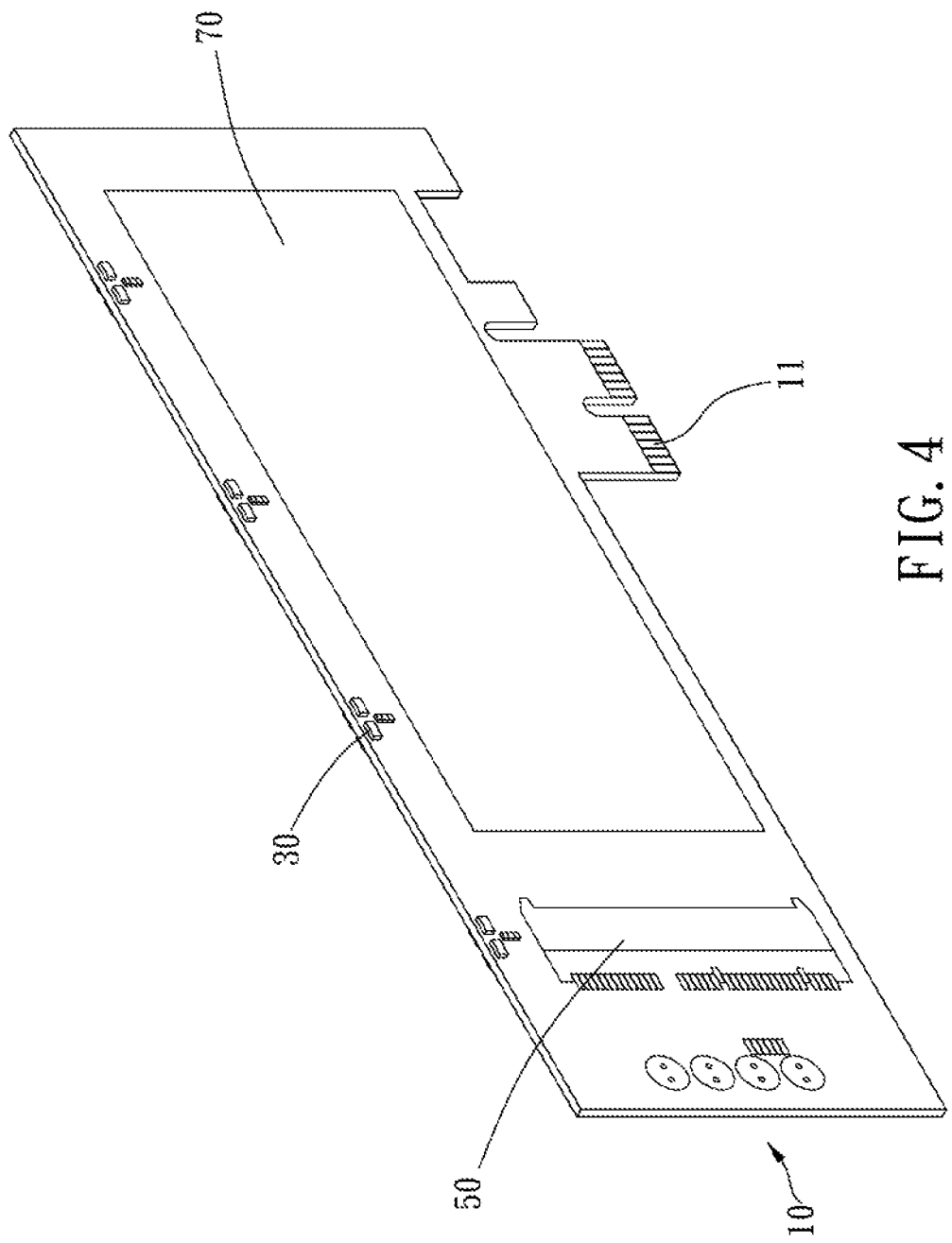
FIG. 4 is a perspective view of a substrate of a preferred embodiment of the present invention.
Figure 6:
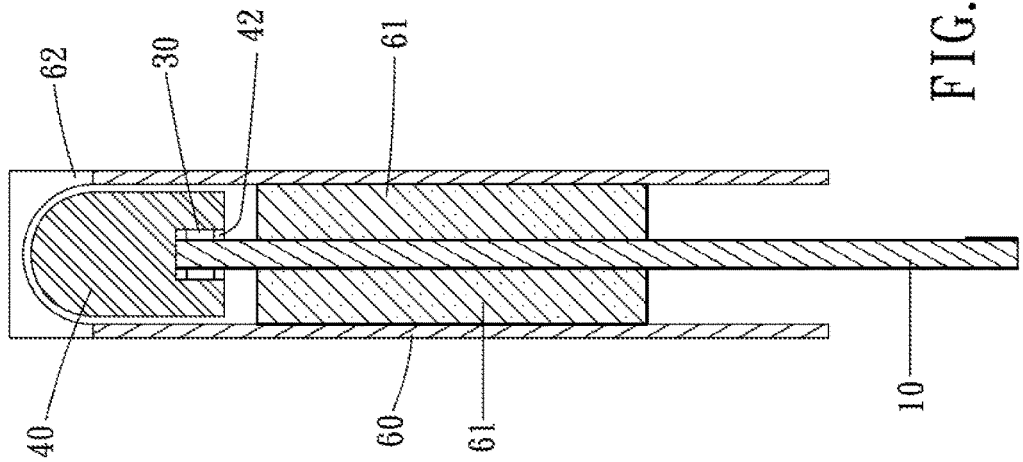
FIG. 6 is a cross-sectional view of FIG. 1.
Figure 5:
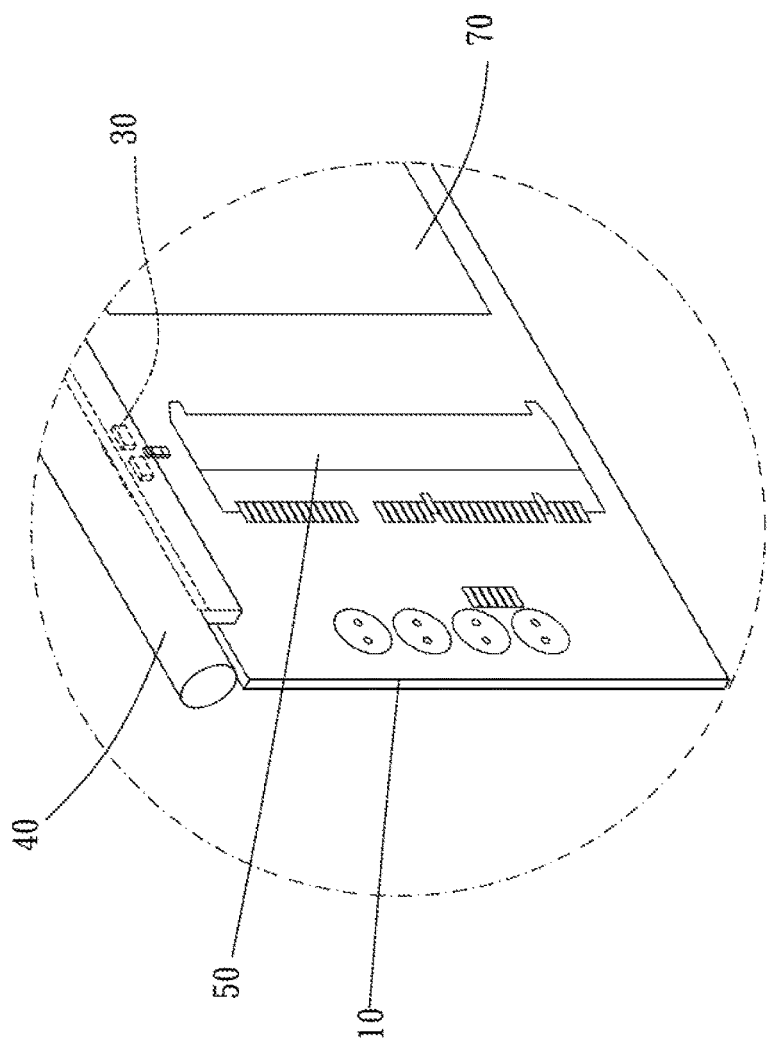
FIG. 5 is a partial enlarged drawing of a light guide member and a substrate of a preferred embodiment of the present invention.
Figure 8:
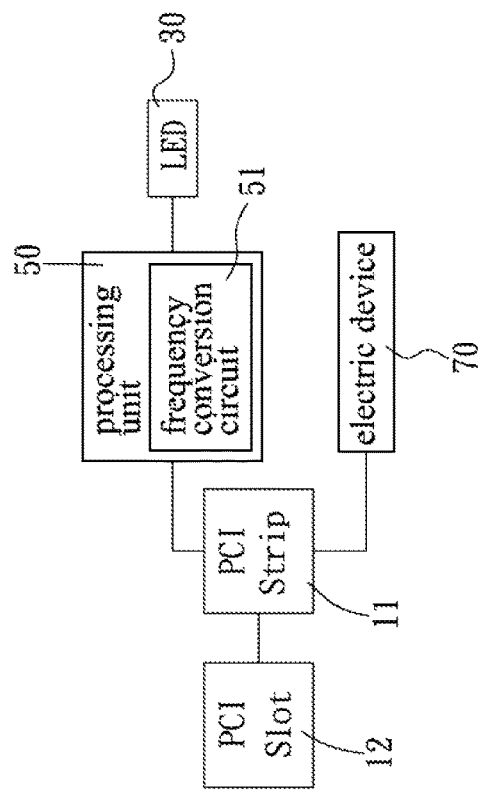
FIG. 8 is a block diagram of another preferred embodiment of the present invention.
Figure 7:
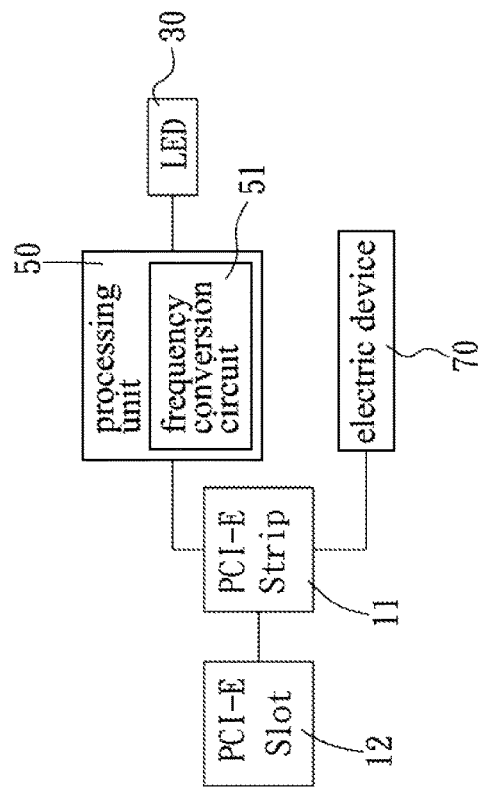
FIG. 7 is a block diagram of a preferred embodiment of the present invention.

The substrate 10 has a PCI-E (Peripheral Component Interconnect Express) strip 11 for being inserted into and electrically connected with a PCI-E slot 12, so that the PCI-E slot 12 can transmit data or provide power to electric elements on the substrate 10. In an embodiment as shown in FIG. 8, the circuit module may include a PCI (Peripheral Component Interconnect) strip 21 for being inserted into and electrically connected with a PCI slot 22, for various motherboards. As shown in FIGS. 1 to 7, in this embodiment, to be compatible to various devices or slots, the PCI-E strip 11 may be a PCI-E x1 strip, PCI-E x2 strip, PCI-E x4 strip, PCI-E x8 strip or PCI-E x16 strip.

The at least one LED 30 is disposed at a side of the substrate 10 opposite to the PCI-E strip 11 and electrically connected with the PCI-E strip 11. In this embodiment, the substrate 10 further includes a processing unit 50, and the processing unit 50 is electrically connected with the PCI-E strip 11 and a plurality of LED 30. The processing unit 50 is configured to control the at least one LED 30 connected or non-connected electrically with the PCI-E strip 11. Specifically, the processing unit 50 further includes a frequency conversion circuit 51 electrically connected with the plurality of LED 30 and the PCI-E strip 11, to control the LEDs 30 to emit light in various frequencies according to a preset program. The circuit module may be provided without any processing unit, and the PCI-E strip is directly connected electrically with the plurality of LEDs, in which the LED lights in response to whether the PCI-E slot provides power to the LED. Alternatively, the circuit module may be provided further with a luminance sensor, temperature sensor or the like, and according to which the LED can light in various modes in different frequencies.

The light guide member 40 at least covers the plurality of LEDs 30, and the light guide member 40 can avoid light projecting directly to one's eye to injure the eye. In addition, the light can be refracted and absorbed by the light guide member 40 so that it is gentle to the eye. Specifically, the light guide member 40 is provided with a first recess 41, the substrate 10 is at least partially received in the first recess 41, and the first recess 41 covers the plurality of LEDs 30. The light guide member 40 is further provided with at least one second recess 42 communicating with the first recess 41, the at least one LED 30 is at least partially received in the at least one second recess 42, so that it requires less thickness of the light guide member 40. As a result, the circuit module 1 does not influence other slots of the motherboard.

Figure 9:
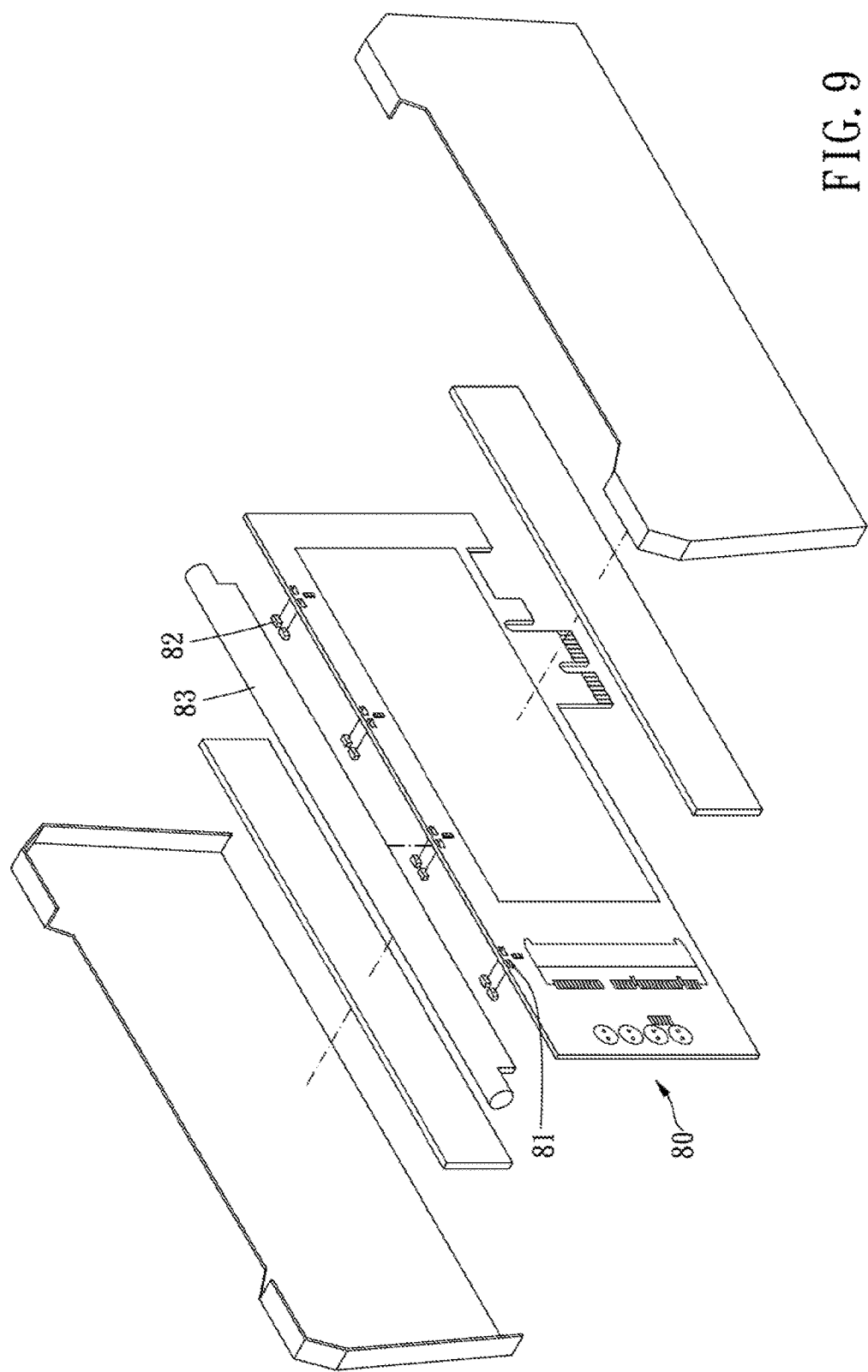
FIG. 9 is a breakdown view of another preferred embodiment of the present invention.
Figure 10:
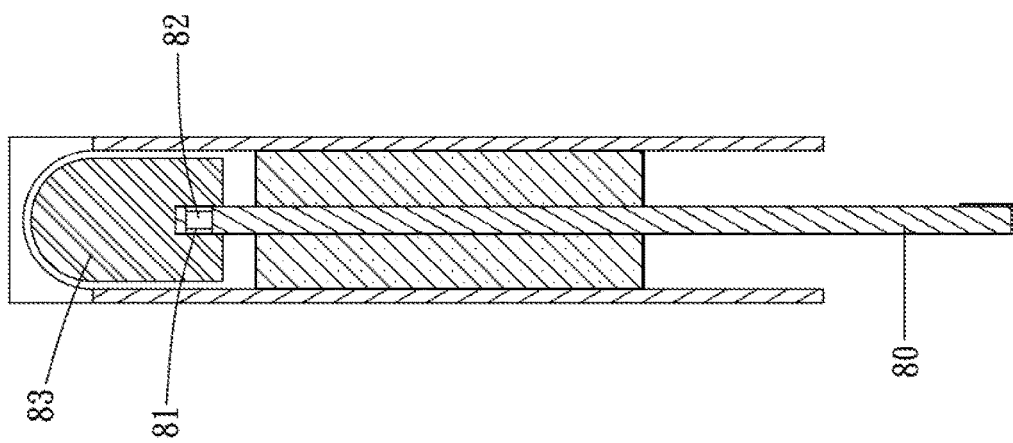
FIG. 10 is a cross-sectional view of another preferred embodiment of the present invention.

In an alternative embodiment as shown in FIGS. 9 and 10, a substrate 80 has at least one penetrating hole 81, and at least one the LED 82 is received in the penetrating hole 81. In this embodiment, a plurality of LEDs 82 are received in a plurality of penetrating holes 81, respectively, and thus the LEDs 82 occupies less space. Furthermore, the light guide member 83 does not need any second recess, thus simplifying manufacturing process of the light guide member. It is noted that, the penetrating hole of the light guide member may receive a LED which is capable of lighting in double-side, and two corresponding side portion of the light guide member disposed on the substrate can both receive the light.

As shown in FIGS. 1-7, the circuit module 1 further includes at least one electric device 70 dispose on the substrate 10, wherein the electric device 70 is electrically connected with the PCI-E strip 11. Each of the at least one electric device 70 includes at least one of a display processing module or a graphical processing module. The circuit module may include other electric device(s) according to various requirements. The electric device 70 can be disposed on only one side or two sides of the substrate 10.

The circuit module 1 further includes at least one housing 60. The at least one housing 60 at least covers two corresponding sides of the substrate 10 and at least covers the light guide member 40, thus protecting the circuit module 1. In this embodiment, the circuit module 1 has a housing 60, and the housing 60 includes two shell members, the two shell members cover the two corresponding sides of the substrate 10, respectively. Specifically, the two shell members are capable of dissipating heat to prevent high temperature of the circuit module 1. Respective one of the two corresponding sides of the substrate 10 is attached with the housing 60 with an adhesive layer 61, so that the housing 60 is firmly attached to the substrate 10 (the adhesive layer may be heat-dissipating adhesive layer). The housing 60 is provided with a plurality of through hole 62 corresponding to the light guide member 40, thus allowing light from the light guide member 40 to project out of the housing 60 via the through holes 62. The housing may be provided with only one narrow and long through hole for light passing therethrough.

Given the above, the light guide member can absorb and refract the light from the LEDs, and thus the light is gentle and pleasant to the eye.

While we have shown and described various embodiments in accordance with the present invention, it should be clear to those skilled in the art that further embodiments may be made without departing from the scope of the present invention.

What is claimed is:

1. A circuit module, including:
    a substrate, having a PCI-E strip, the PCI-E strip for being inserted into and electrically connected with a PCI-E slot;
    at least one LED (light emitting diode), disposed at a side of the substrate opposite to the PCI-E strip, electrically connected with the PCI-E strip;
    a light guide member, being pervious to light, at least corresponding to the at least one LED.

2. The circuit module of claim 1, wherein the substrate is further provided with a processing unit, the processing unit is electrically connected with the PCI-E strip and the at least one LED, and the processing unit is configured to control the at least one LED connected or non-connected electrically with the PCI-E strip.

3. The circuit module of claim 2, wherein the processing unit includes a frequency conversion circuit electrically connected with the at least one LED and the PCI-E strip.

4. The circuit module of claim 1, wherein the light guide member is provided with a first recess, the substrate is at least partially received in the first recess, and the first recess covers the at least one LED.

5. The circuit module of claim 4, wherein the light guide member is further provided with at least one second recess communicating with the first recess, and the at least one LED is at least partially received in the at least one second recess.

6. The circuit module of claim 1, further including at least one housing, the at least one housing at least covers two corresponding sides of the substrate and the light guide member.

7. The circuit module of claim 6, wherein respective one of the two corresponding sides of the substrate is attached with the at least one housing with an adhesive layer.

8. The circuit module of claim 6, wherein the at least one housing is provided with at least one through hole corresponding to the light guide member.

9. The circuit module of claim 1, further includes at least one electric device disposed on the substrate, and the electric device is electrically connected with the PCI-E strip.

10. The circuit module of claim 9, wherein the at least one electric device includes at least one of a graphic processing module and a display processing module.

11. The circuit module of claim 1, wherein the substrate has at least one penetrating hole, and at least one said LED is received in one of the at least one penetrating hole.

12. The circuit module of claim 1, wherein the PCI-E strip is a PCI-E x1 strip, PCI-E x2 strip, PCI-E x4 strip, PCI-E x8 strip or PCI-E x16.

13. A circuit module, including:
    a substrate, having a PCI strip, the PCI strip for being inserted into and electrically connected with a PCI slot;
    at least one LED, disposed at a side of the substrate opposite to the PCI strip, electrically connected with the PCI strip;
    a light guide member, being pervious to light, at least corresponding to the at least one LED.

* * * * *